US006469559B2

(12) United States Patent
Heightley

(10) Patent No.: US 6,469,559 B2
(45) Date of Patent: Oct. 22, 2002

(54) SYSTEM AND METHOD FOR ELIMINATING PULSE WIDTH VARIATIONS IN DIGITAL DELAY LINES

(75) Inventor: John Heightley, Colorado Springs, CO (US)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/007,875

(22) Filed: Nov. 8, 2001

(65) Prior Publication Data

US 2002/0053932 A1 May 9, 2002

Related U.S. Application Data

(63) Continuation of application No. 09/542,511, filed on Apr. 3, 2000, now Pat. No. 6,339,354.

(51) Int. Cl.⁷ .............................................. H03H 11/26
(52) U.S. Cl. ....................... 327/278; 327/264; 327/284; 327/288
(58) Field of Search ................................. 327/261–264, 327/276–278, 284, 285, 288, 149, 158, 161, 172–174, 182, 231, 233, 234, 165; 375/371, 373, 376, 362; 365/233, 233.5, 194; 331/DIG. 2, 1 A

(56) References Cited

U.S. PATENT DOCUMENTS 4,899,071 A * 2/1990 Morales ...................... 327/277
5,039,893 A * 8/1991 Tomisawa ................... 327/276
5,231,319 A * 7/1993 Crafts et al. ................ 327/277
6,147,532 A * 11/2000 Ueda .......................... 327/149
6,313,681 B1 * 11/2001 Yoshikawa .................. 327/161

OTHER PUBLICATIONS

A Low–Power CMOS Time–to–Digital Converter, IEEE Journal of Solid–State Circuits, vol. 30, No. 9, Raisanen–Ruotsalainen et al., 9/95.
Clock Buffer Chip with Multiple Target Automatic Skew Compensation, IEEE Journal of Solid–State Circuits, vol. 30, No. 11, Watson, Jr. & Iknaian, 11/95.
A 64–Mbit, 640–MByte/s Bidirectional Data Strobed, Double–Data–Rate SDRAM with a 40–mW DLL for a 256–MByte Memory System, IEEE Journal of Solid–State Circuits, vol. 33, No. 11, Kim et al., 11/98.
The Delay Vernier Pattern Generation Technique, IEEE Journal of Solid–State Circuits, vol. 32, No. 4, Moyer et al. 4/97.

(List continued on next page.)

Primary Examiner—Timothy P. Callahan
Assistant Examiner—Minh Nguyen
(74) Attorney, Agent, or Firm—William J. Kubida; Peter J. Meza; Hogan & Hartson LLP

(57) ABSTRACT

A system and method for eliminating pulse width variations in digital delay lines partitions a delay line into two substantially identical blocks of delay inverters, inserting a first inverter between the two blocks and a second substantially identical inverter at the output of the second block. The requirement for matching device characteristics at the individual delay inverter level is eliminated and the only requirement is that the parasitic loading of the inverter between the blocks and the inverter on the output of the second block be the same. Consequently, the layout of the delay inverters in a single block may be made in the most efficient manner possible and the same identical layout can be used for the first and second blocks.

17 Claims, 3 Drawing Sheets

OTHER PUBLICATIONS

A Portable Clock Multiplier Generator Using Digital CMOS Standard Cells, IEEE Journal of Solid–State Circuits, vol. 31, No. 7, Combes et al., 7/96.

A 250–622 MHZ Deskew and Jitter–Suppressed Clock Buffer Using Two–Loop Architecture, IEEE Journal of Solid–State Circuits, vol. 31, No. 4, Tanoi, 4/96.

An Integrated High Resolution CMOS–Timing Generator Based on an Array of Delay Locked Loops, IEEE Journal of Solid–State Circuits, vol. 31, No. 7, Christainsen, 7/96.

A 800MB/s 72Mb SLDRAM with Digitally–Calibrated DLL, IEEE Journal of Solid–State Circuits Conference/ Session 24/Paper WP24.3, Paris et al., 6/99.

* cited by examiner

SYSTEM AND METHOD FOR ELIMINATING PULSE WIDTH VARIATIONS IN DIGITAL DELAY LINES

RELATED APPLICATION

The present application is a continuation of U.S. patent application Ser. No. 09/542,511 filed Apr. 3, 2000, which is now U.S. Pat. No. 6,339,354 incorporated herein by reference.

The present invention is related to the subject matter disclosed in U.S. patent applications Ser. No. 09/541,876 for: "System and Method of Compensating for Non-Linear Voltage-to-Delay Characteristics in a Voltage Controlled Delay Line" and Ser. No. 09/542,509 for: "Low Power Consumption Integrated Circuit Delay Locked Loop and Method for Controlling the Same", both filed on even date herewith and assigned to Mosel Vitelic, Inc., assignee of the present invention, the disclosures of which are specifically incorporated herein by this reference.

BACKGROUND OF THE INVENTION

The present invention relates, in general, to the field of systems and methods for eliminating pulse width variations in digital delay lines. More particularly, the present invention relates to a system and method for ensuring the accurate preservation of the width of pulses propagated through relatively long delay voltage controlled delay lines of particular utility in conjunction with delay locked loops ("DLL") such as those utilized in double data rate ("DDR") dynamic random access memory ("DRAM") devices, processors and other integrated circuit ("IC") devices and semiconductor processes.

One particular application of relatively long delay voltage controlled delay lines is in conjunction with DDR DRAMs. Currently, these memory ICs are able to achieve an effective doubling of the device's bandwidth by inclusion of DLL circuitry to achieve synchronization of data accesses at a point in time to enable the reading of data on both the rising and falling edges of each clock cycle. In such DLL circuits, a phase detector is utilized to determine the relative phase between two clock signals, such as the system clock and synchronization ("sync") clock signals. In any event, the DLL is operational to adjust one or more control voltages applied to a voltage controlled delay line until the two clock signals are perfectly in phase.

In order to delay a digital pulse or stream of pulses in such a DLL circuit, a string of an even number of series coupled inverters is often used. If it is desired to make the delay variable, the inverters may include some means of adjusting the delay through the inverter with an applied external voltage level. If comparatively long delays are required, such as those often used in DLLs, the number of inverters in the chain can be relatively high, e.g. on the order of twenty or more.

In order for a pulse to propagate through the delay line without any change in pulse width, there are two possibilities: 1) the propagation delays for both the rising inputs and falling inputs must be made identical for each individual inverter; or 2) the delay for rising edge inputs are made identical on an odd-even basis and the delay for falling edge inputs are made identical on an odd-even basis. In this latter regard, an "odd-even" basis means inverter pairs 1 and 2, 3 and 4 etc. The former case is very difficult to achieve because of the variations in the pull-up or pull-down devices in the individual delay inverters. Consequently, it is easier to achieve the latter case, but it too requires that each odd-even pair of delay inverters be made identical and that the parasitic loading between all inverters also be the same. These restrictions are even more critical if voltage controlled delay inverters are used (as in DLL's) because of the added sensitivity to device parameters. For efficient layout of the delay line and to minimize sensitivity in an integrated circuit, it is most desirable to eliminate the requirement for everything to be matched at the individual inverter level.

SUMMARY OF THE INVENTION

In accordance with the system and method disclosed herein, a delay line is partitioned into two substantially identical blocks of delay inverters with a first inverter being inserted between the two blocks and a second substantially identical inverter at the output of the second block. In this manner, the requirement for matching at the individual delay inverter level is eliminated and the only requirement is that the parasitic loading of the inverter between the blocks and the inverter on the output of the second block be the same. The layout of the delay inverters in a single block can be effectuated in the most efficient manner possible and the same identical layout can be used for the first and second blocks.

Since the rising edge input to the first block becomes a falling edge input to the second block as it propagates through the delay line, the rising and falling input edges will encounter an identical set of transitions as they propagate through the two blocks. If the loading of the inverter at the output of the first block and that of the inverter at the output of the second block are identical, the pulse width will be perfectly preserved.

Particularly disclosed herein is delay line for delaying an input signal between input and output lines thereof, the delay line comprising first and second substantially identical blocks of delay elements, the first block of delay elements being coupled to receive the input signal on the input line; a first inverter coupled to an output of the first block of delay elements for providing an inverted delayed signal to the second block of delay elements; and a second substantially identical inverter coupled to an output of the second block of delay elements for providing a re-inverted delayed signal on the output line.

Also disclosed herein is a method for delaying a signal received on an input line and providing a delayed output signal on an output line. The method comprises the steps of: providing first and second substantially identical blocks of delay elements; coupling the first block of delay elements to receive the input signal on the input line; providing first and second substantially identical inverters; coupling the first inverter to an output of the first block of delay elements; providing an inverted delayed signal to the second block of delay elements at an output of the first inverter; receiving the inverted delay signal at an input of the second block of delay elements; and coupling the second inverter to an output of the second block of delay elements for providing the delayed signal on the output line.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
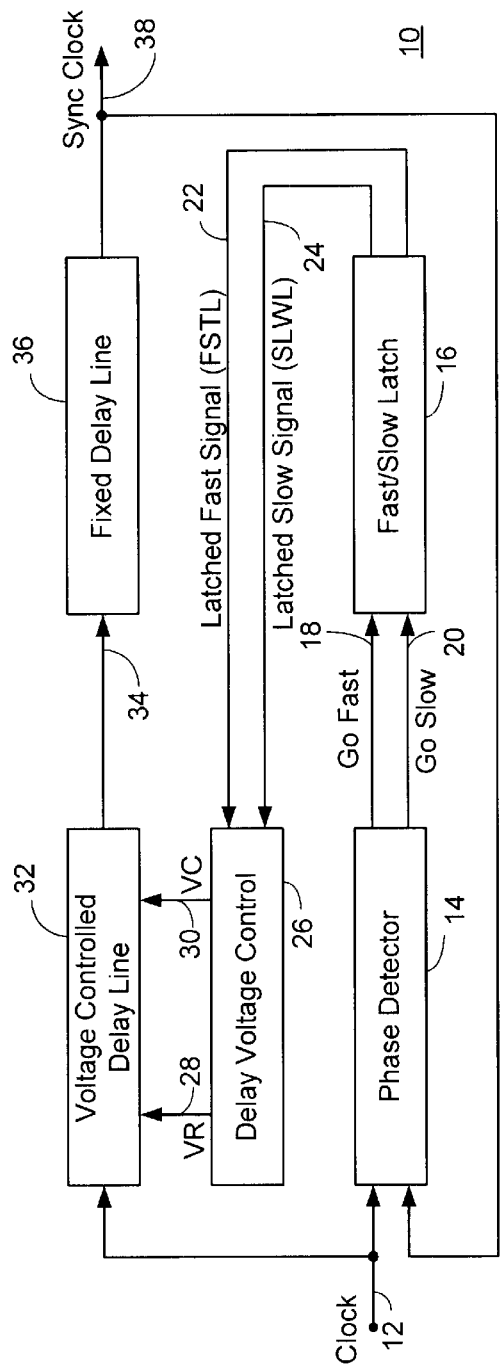
FIG. 1 is a simplified logic block diagram of a delay locked loop ("DLL") circuit for use, for example, in a double data rate ("DDR") dynamic random access memory ("DRAM") device.

With reference now to FIG. 1, a simplified logic block diagram of a delay locked loop ("DLL") circuit 10 is shown for use, for example, in a double data rate ("DDR") dynamic random access memory ("DRAM") device. The DLL circuit 10 receives a clock signal input on line 12 forming one input to a phase detector 14. The phase detector 14 provides inputs to a fast/slow latch circuit 16 in the form of a "Go Fast" signal on line 18 and a "Go Slow" signal on line 20.

In turn, the fast/slow latch circuit 16 provides a latched fast signal ("FSTL") on line 22 and latched slow signal ("SLWL") on line 24 for input to a delay voltage control circuit 26. The delay voltage control circuit 26 provides one or more control voltage signals, such as a VR signal on output line 28 and VC signal on output line 30, for input to a voltage controlled delay line circuit 32. The voltage controlled delay line circuit 32 supplies a signal on line 34 for input to a fixed delay line circuit 36 which provides a synchronous ("sync") clock output on line 38 which is also fed back to a second input of the phase detector 14.

In operation, the phase detector 14 determines the relative phase between the clock signal on line 12 and the sync clock signal on line 38 and adjusts the control voltages VC and VR going to the voltage controlled delay line circuit 32 until the two clock signals are in phase. The fast/slow latch circuit 16 generates a pulse on one of the latched signal lines 22, 24 when a delay adjustment is required that is used to make small adjustments to the control voltages VC and VR.

Figure 2:
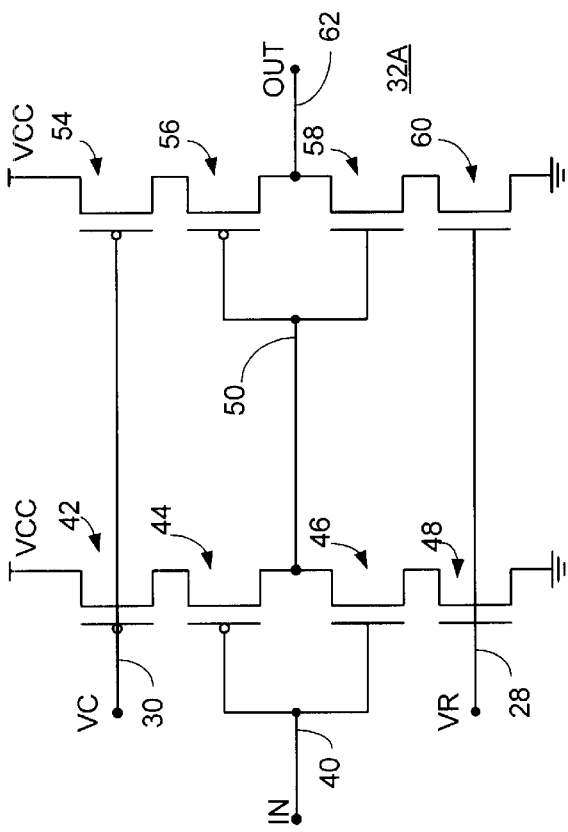
FIG. 2 is a schematic diagram of a voltage controlled delay inverter circuit forming a portion of the voltage controlled delay line circuit of the DLL circuit of FIG. 1.

With reference additionally now to FIG. 2, a schematic diagram of a typical voltage controlled delay inverter circuit 32A is illustrated forming a portion of the voltage controlled delay line circuit 32 of the DLL circuit 10 of FIG. 1. In a particular embodiment of the present invention for use, for example, in a 64Meg DDR DRAM memory device, twenty series connected voltage control delay inverter circuits 32A such as the one illustrated may be used to form the voltage controlled delay line circuit 32 while some other number of fixed delay circuits (e.g. twenty four) may be used to form the fixed delay line circuit 36.

Each of the voltage controlled delay inverter circuits 32A receives at least one control voltage signal, such as VC and VR input on lines 30 and 28 respectively. An input to each successive one of the circuits 32A is received on line 40. The circuits 32A may comprise a pair of series connected CMOS transistors strings comprising P-channel transistors 42 and 44 coupling a supply voltage ("VCC") to circuit ground through N-channel transistors 46 and 48. Similarly, P-channel transistors 54 and 56 couple VCC to circuit ground through N-channel transistors 58 and 60.

The VC signal on line 30 is supplied to the gate terminals of P-channel transistors 42 and 54 while the VR signal on line 28 is supplied to the gate terminals of N-channel transistors 48 and 60. The input line 40 is coupled to the common connected gate terminals of P-channel transistor 44 and N-channel transistor 46. Node 50 intermediate P-channel transistor 44 and N-channel transistor 46 is coupled to the common connected gate terminals of P-channel transistor 56 and N-channel transistor 58. The output of the circuit 32A is taken at a node 62 intermediate P-channel transistor 56 and N-channel transistor 58.

Figure 3:
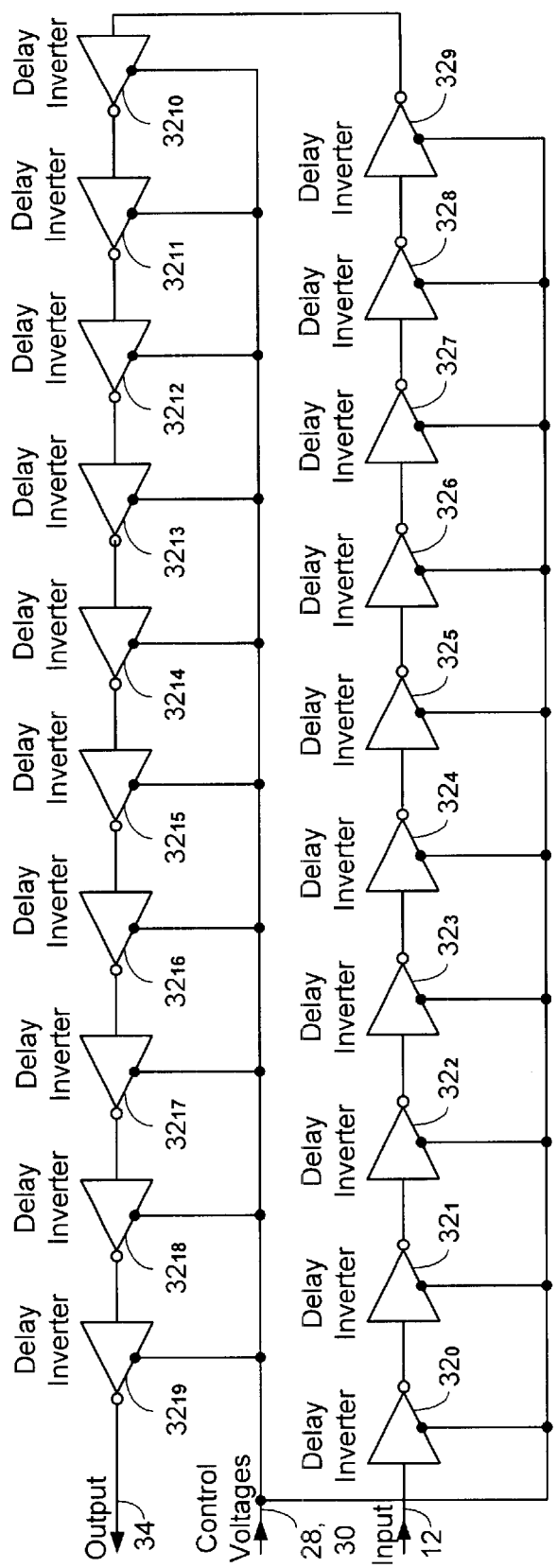
FIG. 3 is a simplified schematic illustration of a conventional variable delay line circuit for use in a DLL.

With reference additionally now to FIG. 3, a simplified schematic illustration of a conventional variable delay line circuit 32 is shown for possible use in a DLL circuit 10 (FIG. 1). The conventional variable delay line circuit 32 comprises a relatively large number (e.g. twenty) of series connected delay inverters $32_0$ through $32_{19}$ inclusive, each of which may be formed in accordance with the configuration of the delay inverter 32A shown in the preceding figure. In the example illustrated, the input to the variable delay line circuit 32 may comprise a clock signal 12. One or more control voltage signals (e.g. VR and VC) may be input as control voltages on lines 28 and 30 respectively. The output of the variable delay line circuit 32 may be applied on line 34 to a fixed delay line circuit 36 (FIG. 1) or other circuitry depending on the particular application.

As previously noted, in order for a pulse input on line 12 to propagate through the delay line 32 without any change in pulse width, there are two possibilities: 1) the propagation delays for rising inputs and falling inputs are made identical for each individual delay inverter $32_0$–$32_{19}$; or 2) the delay for rising edge inputs are identical on an odd-even basis and the delay for falling edge inputs are identical on an odd-even basis. In this regard, an "odd-even" basis means delay inverters $32_0$ with $32_1$; $32_2$ with $32_3$ etc. The first case is very difficult to achieve, at least in part because of the variations in the pull-up or pull-down devices in each of the delay inverters $32_0$–$32_{19}$ (as illustrated in FIG. 2). It is, therefore, easier to achieve the second case, but it still requires that each odd-even pair of delay inverters $32_0$–$32_{19}$ be identical and that the parasitic loading between all delay inverters be identical. These restrictions are even more critical if voltage controlled delay inverters $32_0$–$32_{19}$ are used in DLLs (e.g. the DLL 10 as shown in FIG. 1) because of the added sensitivity of such delay inverters to individual device parameters. For efficient layout of the voltage controlled delay line 32 and to minimize sensitivity in an integrated circuit application, it is desirable to eliminate the requirement for everything to be matched at the individual inverter level.

Figure 4:
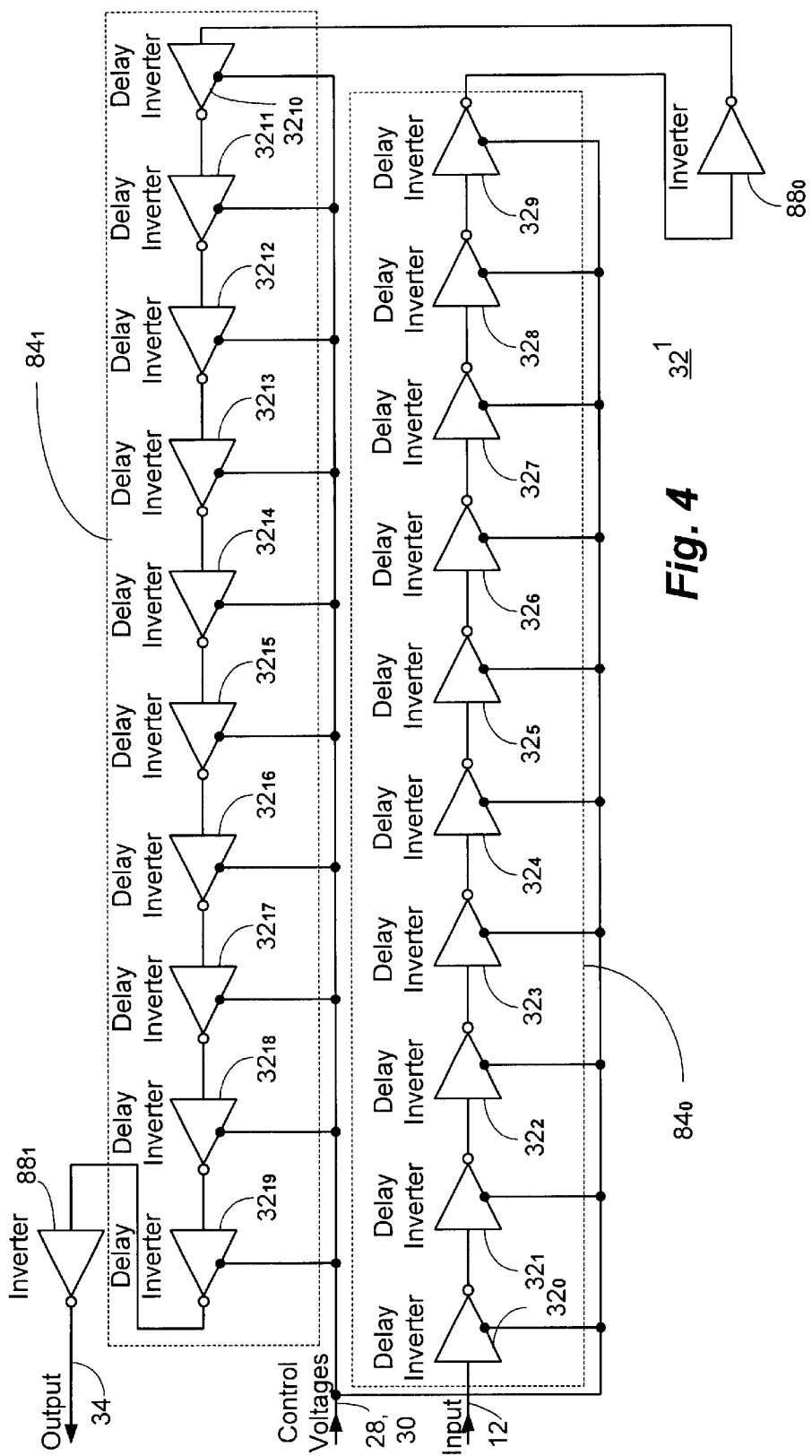
FIG. 4 is a simplified schematic illustration of a corresponding variable delay line circuit in accordance with the principles of the present invention.

With reference additionally now to FIG. 4, a simplified schematic illustration of a corresponding variable delay line circuit $32^1$ in accordance with the principles of the present invention is shown also for possible use in conjunction with a DLL circuit 10 (FIG. 1). The variable delay line circuit $32^1$ comprises a number of series connected delay inverters $32_0$ through $32_9$ and $32_{10}$ through $32_{19}$ inclusive separated into two separate delay blocks $84_0$ and $84_1$ respectively. Each of the delay inverters $32_0$ through $32_9$ and $32_{10}$ through $32_{19}$ may be formed in accordance with the configuration of the delay inverter 32A shown in FIG. 2. The inverters $88_0$ and $88_1$ may be conventional CMOS inverters or comprise any other suitable inverter structure or process.

Again, in the example illustrated, the input to the variable delay line circuit 32 may comprise a clock signal 12. One or more control voltage signals (e.g. VR and VC) may be input as control voltages on lines 28 and 30 respectively. The output of the variable delay line circuit 32 may be applied on line 34 to a fixed delay line circuit 36 (FIG. 1) or other circuitry depending on the particular application.

By partitioning the delay line $32^1$ into two identical blocks of inverters $84_0$ and $84_1$ and inserting a first inverter $88_0$ between the two blocks ($84_0$ and $84_1$) and a second inverter $88_1$ at the output of the second block ($84_1$), the requirement for matching at the individual inverter $32_0$–$32_{19}$ level is eliminated. The only requirement is that the inverter $88_0$ and inverter $88_1$ be identical and have the same parasitic loading. Matching of these inverters is relatively easy to effectuate since the same inverter layout can be used in both cases and the input drive to each is identical. The layout of the inverters $32_n$ in a single block ($84_0$ or $84_1$) can be done in the most efficient manner possible and the same identical layout can be used for the first and second blocks $84_0$ or $84_1$.

Since the rising edge input to the first block $84_0$ becomes a falling edge input to the second block $84_1$ as it propagates through the delay line $32^1$, the rising and falling input edges will encounter an identical set of transitions as they propagate through the two blocks $84_0$ and $84_1$. If the loading of the inverter $88_0$ at the output of the first block and $88_1$ at the output of the second block is identical, the pulse width will be perfectly preserved.

While there have been described above the principles of the present invention in conjunction with specific circuit implementations and applications it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any hovel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A variable delay line for delaying an input clock signal between input and output lines thereof, the delay line comprising:
    first and second separate blocks of voltage-controlled CMOS delay inverters coupled in series to receive said input clock signal on said input line, wherein the propagation delay of individual said delay inverters in each of said first and second blocks are at least partially non-identical and said first and second blocks have substantially identical block level integrated circuit layouts;
    a first inverter coupled to an output of said first block of delay inverters for providing an inverted delayed signal to said second block of delay inverters;
    a second inverter coupled to an output of said second block of delay inverters for providing a re-inverted delayed signal on said output line; and
    wherein said first and second inverters are non-voltage controlled inverters having substantially equivalent parasitic loading and the same inverter layout.

2. The variable delay line as in claim 1 in which the CMOS delay inverters each further comprises a control terminal for receiving a control signal.

3. The variable delay line as in claim 1 in which the first and second blocks each comprises an even number of CMOS delay inverters.

4. The variable delay line as in claim 1 in which the first and second blocks each comprises at least ten CMOS delay inverters.

5. A delay line for delaying an input signal between input and output lines thereof, the delay line comprising:
    first and second blocks of delay elements coupled to receive said input signal on said input line, wherein the propagation delay of individual delay elements in each of said first and second blocks is at least partially unequal and said first and second blocks have substantially identical block level integrated circuit layouts;
    a first non-voltage controlled inverter coupled to an output of said first block of delay elements for providing an inverted delayed signal to said second block of delay elements,
    a second non-voltage controlled inverter coupled to an output of said second block of delay elements for providing a re-inverted delayed signal on said output line; and
    wherein the propagation delay of said first and second inverters is equal.

6. The delay line as in claim 5 in which the delay line further comprises means for varying the delay of the input signal.

7. The delay line as in claim 5 in which the delay elements of the first and second blocks each further comprises a control terminal for receiving a control signal.

8. The delay line as in claim 5 in which the first and second blocks each comprises an even number of CMOS delay inverters.

9. The delay line as in claim 5 in which the first and second blocks each comprises at least ten CMOS delay inverters.

10. The delay line as in claim 5 in which the input signal comprises an input clock signal.

11. The delay line as in claim 5 in which each of the delay elements comprises a voltage-controlled CMOS inverter.

12. The delay line as in claim 5 in which the first and second inverters each has substantially equivalent parasitic loading.

13. The delay line as in claim 5 in which the first and second inverters each has the same inverter layout.

14. A delay line for delaying an input signal between input and output lines thereof, the delay line comprising:
    first and second blocks of delay elements coupled to receive said input signal on said input line, wherein the propagation delay of individual delay elements in each of said first and second blocks is unequal and said first and second blocks have substantially identical propagation delays;
    a first non-voltage controlled inverter coupled to an output of said first block of delay elements for providing an inverted delayed signal to said second block of delay elements,
    a second non-voltage controlled inverter coupled to an output of said second block of delay elements for providing a re-inverted delayed signal on said output line; and
    wherein the inverter layout of said first and second inverters is the same.

15. The delay line as in claim 14 in which the delay line further comprises means for varying the delay of the input signal.

16. The delay line as in claim 14 in which the first and second blocks each comprises an even number of CMOS delay inverters.

17. The delay line as in claim 14 in which each of the delay elements comprises a voltage-controlled CMOS inverter.

* * * * *